(12) United States Patent
Sun

(10) Patent No.: US 7,641,495 B1
(45) Date of Patent: Jan. 5, 2010

(54) MOUNTING APPARATUS FOR EXPANSION CARD

(75) Inventor: Zheng-Heng Sun, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/346,783

(22) Filed: Dec. 30, 2008

(30) Foreign Application Priority Data

Dec. 16, 2008 (CN) .................. 2008 1 0306261

(51) Int. Cl.
*H01R 13/62* (2006.01)
(52) U.S. Cl. ...................... 439/327; 439/328
(58) Field of Classification Search ............. 439/327, 439/328
See application file for complete search history.

(56) References Cited

U.S. PATENT DOCUMENTS

| | | | | |
|---|---|---|---|---|
| 6,183,284 B1 * | 2/2001 | Gill et al. | ..................... | 439/327 |
| 6,305,964 B1 * | 10/2001 | Pon et al. | ..................... | 439/327 |
| 6,319,037 B1 * | 11/2001 | Lai | ............................ | 439/327 |
| 2008/0074850 A1 * | 3/2008 | Kuo | ........................... | 439/327 |

* cited by examiner

*Primary Examiner*—Tho D Ta
(74) *Attorney, Agent, or Firm*—Zhigang Ma

(57) ABSTRACT

A mounting apparatus for fixing an expansion card includes a connector configured for engagingly receiving a bottom portion of the expansion card, and a latching member made by thin strip material. The latching member includes a top wall, and two sidewalls extending down from opposite sides of the top wall configured for sandwiching the expansion card therebetween. An elastic tab extends between the sidewalls from the top wall, configured for elastically resisting against a top of the expansion card. A clipping portion is formed on a bottom of each sidewall, to engage with the connector.

10 Claims, 3 Drawing Sheets

MOUNTING APPARATUS FOR EXPANSION CARD

BACKGROUND

1. Technical Field

The present disclosure relates to mounting apparatuses and, more particularly, to a mounting apparatus for an expansion card.

2. Description of Related Art

An expansion card, such as a memory card, is installed in an electronic device, such as a computer or a server with a mounting apparatus. The mounting apparatus generally includes two opposite fixing latches for clamping two opposite ends of the expansion card. However, the fixing latches may block airflow to the expansion card. In a chassis having a plurality of expansion cards fixed in parallel, heat produced by the expansion cards can only be dissipated through the narrow spaces between the cards, which is inefficient.

DETAILED DESCRIPTION

Figure 1:
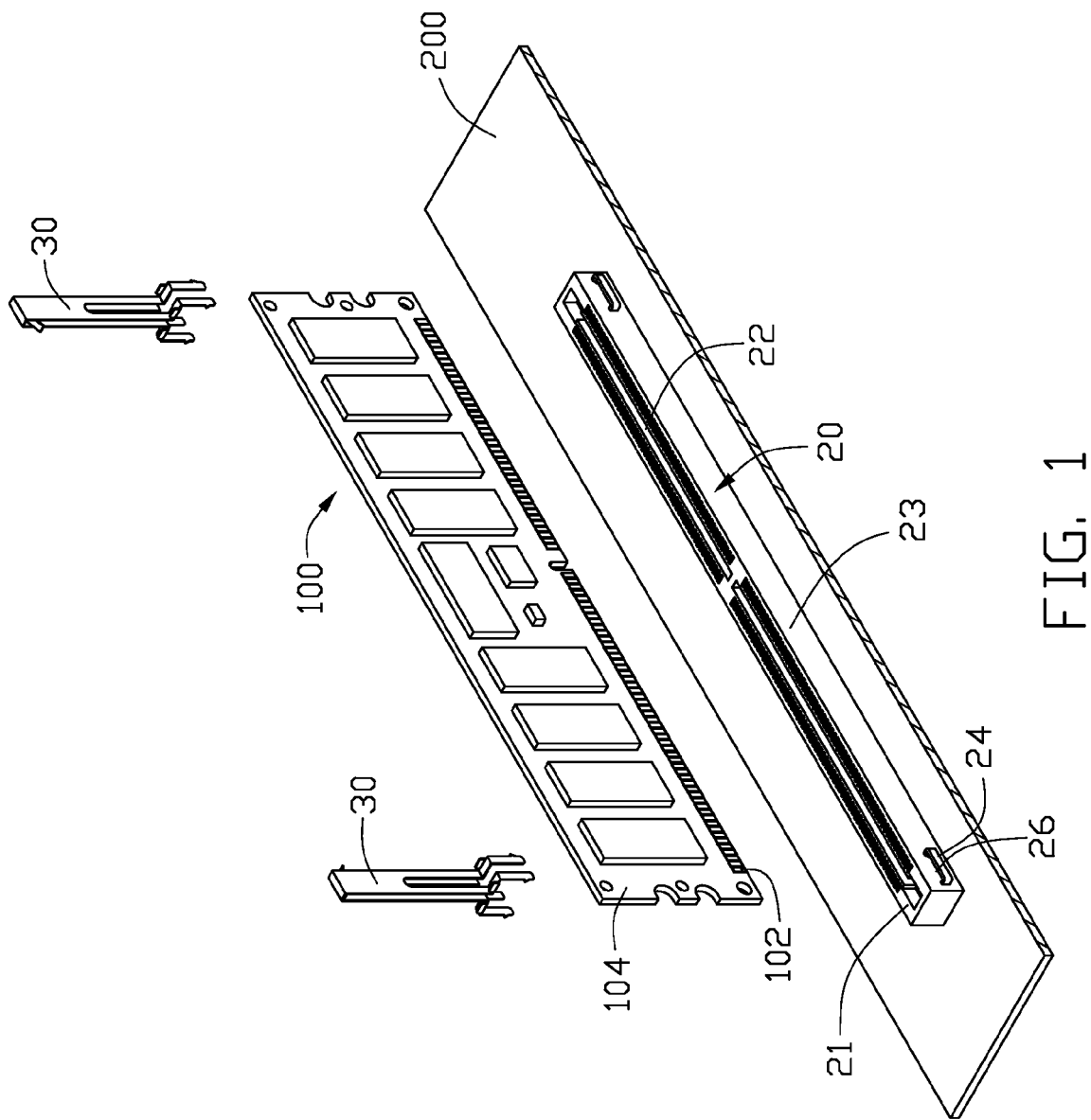
FIG. 1 is an exploded, isometric view of an exemplary embodiment of a mounting apparatus, together with an expansion card and a printed circuit board, the mounting apparatus including two latching members.

Referring to FIG. 1, an exemplary embodiment of a mounting apparatus is provided for fixing an expansion card 100 to a printed circuit board (PCB) 200. The mounting apparatus includes a connector 20 mounted on the PCB 200 and two latching members 30.

Two horizontally spaced, aligned contacts 102 are formed on a bottom portion of the expansion card 100. The expansion card 100 includes two opposite ends 104.

The connector 20 is elongated and includes a top surface 21 and two sidewalls 23 perpendicularly connected between the top surface 21 and the PCB 200. The connector 20 further includes two opposite end portions. The top surface 21 defines a slot 22 arranged in a line between the end portions, for receiving and being electrically connected to the contacts 102. Two bridge-shaped locking parts 24 protrude from the sidewalls 23 at each end portion. A through hole 26 is defined between each locking part 24 and the corresponding sidewall 23.

Figure 2:
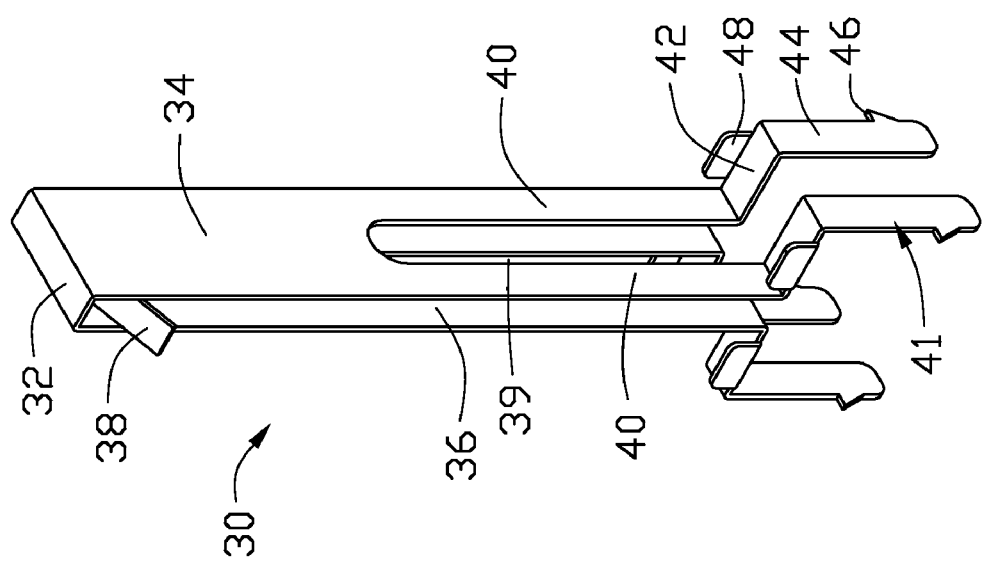
FIG. 2 is an enlarged view of a latching member of FIG. 1.

Referring to FIG. 2, each latching member 30 is generally U-shaped and made from a bent thin metal strip. The latching member 30 includes a top wall 32 and two sidewalls 34 perpendicularly extending down from opposite sides of the top wall 32. The top wall 32 and the sidewalls 34 bound a receiving space 36. An elastic tab 38 slantingly extends down from the bottom of the top wall 32 into the receiving space 36. An upside down U-shaped slot 39 is defined in a lower part of each sidewall 34, with two elastic parts 40 formed on the sidewall 34 at opposite sides of the slot 39. An L-shaped clipping portion 41 extends from a distal end of each elastic part 40 opposite to the top wall 32. The clipping portion 41 includes a horizontal part 42 perpendicularly extending outward from the distal end of the elastic part 40, and a clipping part 44 perpendicularly extending down from a distal end of the horizontal part 42 opposite to the elastic part 40. A hook 46 extends outward from a side of the clipping part 44, coplanar with the clipping part 44. An operation tab 48 perpendicularly extends up from a side of the horizontal part 42 opposite to the slot 39, for convenient manipulation of the clipping portion 41.

Figure 3:
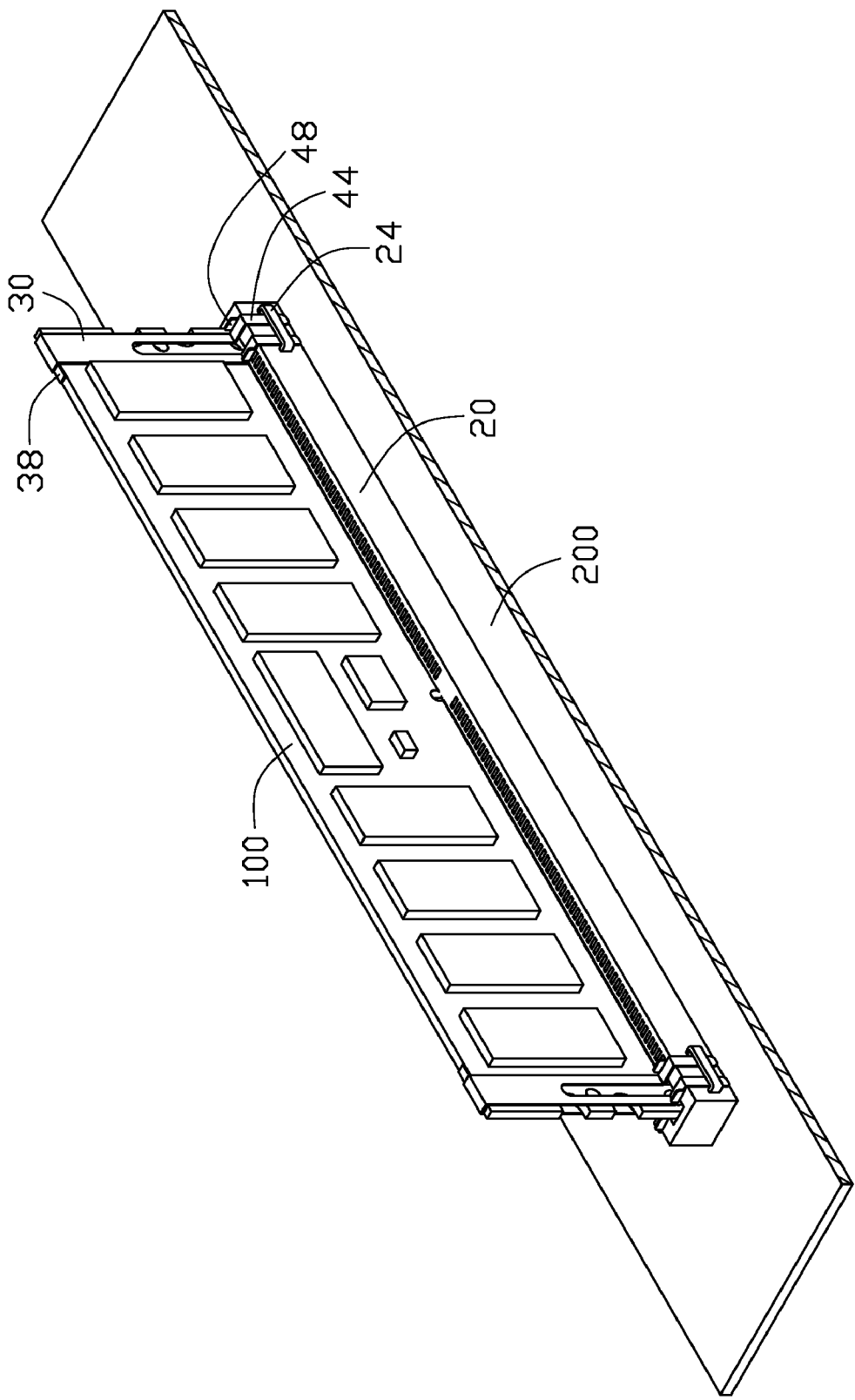
FIG. 3 is an assembled view of FIG. 1.

Referring to FIG. 3, in use, the contacts 102 of the expansion card 100 are inserted into the slot 22 of the connector 20. The receiving space 36 of each latch member 30 receives a corresponding end of the expansion card 100. Two elastic parts 40 of each sidewall 34 are squeezed toward each other to deform, to make the clipping parts 44 of the two clipping portions 41 pass through the through hole 26 of the connector 20. The elastic parts 40 are then released, and the clipping portions 41 restore to engage with the locking part 24 of the connector 20, via the hooks 46 of the clipping portions 41 hooking opposite ends of the locking part 24. The horizontal part 42 of each clipping portion 41 resists against the top surface 21 of the connector 20, and the clipping part 44 of each clipping portion 41 resists against a corresponding sidewall 23 of the connector 20. The elastic tab 38 elastically resists against the top of the expansion card 100 to deform.

In disassembling the expansion card 100, the operation tabs 48 of the sidewalls 34 are squeezed toward each other, to deform the elastic parts 40 and the clipping portions 41. As a result, the hooks 46 disengage from the locking part 24. The elastic tab 38 is restored to pry up the latching member 30, resulting in the clipping parts 44 disengaging from the locking part 24. Therefore, the expansion card 100 can be removed from the slot 22 of the connector 20.

In other embodiments, the clipping parts 44 of each latching member 30 may extend from the sidewalls 34 directly with the operation tabs 48 formed on the elastic parts 40, to omit the horizontal parts 42, and the through hole 26 may be defined in the top of each end portion of the connector 20. In use, the hooks 46 of each sidewall 34 are engaged with a sidewall bounding an edge of the through hole 26. In another embodiment, each latching member 30 can be made of elastic plastic material.

Each latching member 30 is made of thin plate, resisting against the connector 20 and the expansion card 100, and blocks only a little, if any, airflow, greatly enhancing dissipation of heat of the expansion card 100.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the disclosure.

What is claimed is:

1. A mounting apparatus for fixing an expansion card, the mounting apparatus comprising:
   a connector configured for engagingly receiving a bottom portion of the expansion card; and
   a latching member made by thin strip material, wherein the latching member comprises a top wall, and two sidewalls extending down from opposite sides of the top wall configured for sandwiching the expansion card therebetween; an elastic tab extends between the sidewalls from the top wall, configured for elastically resisting against a top of the expansion card; at least one clipping portion is formed on a bottom of each sidewall, to engage with the connector;
   wherein an upside down U-shaped slot is defined in the lower part of each sidewall, with two elastic parts formed at opposite sides of the slot, the elastic parts are capable of being deformed toward each other, the at least one clipping portion comprises two clipping portions extending from distal ends of the elastic parts, respectively;

the connector comprises a top surface, and two sidewalls perpendicular to the top surface; each clipping portion comprises a horizontal part perpendicularly extending outward from the distal end of a corresponding elastic part to resist against the top surface of the connector, and a clipping part perpendicularly extending down from a distal end of the horizontal part opposite to the elastic part to resist against a corresponding sidewall of the connector.

2. The mounting apparatus of claim 1, wherein the latching member is made of metal.

3. The mounting apparatus of claim 1, wherein the latching member is made of plastic.

4. The mounting apparatus of claim 1, wherein the connector further comprises two opposite end portions, the sidewalls of the connector are located between the end portions; two bridge-shaped locking parts extend from the sidewalls at each end portion, each for engaging with the clipping part of a corresponding clipping portion.

5. The mounting apparatus of claim 4, wherein a through hole is defined between each locking part and a corresponding sidewall of the connector, for the corresponding clipping part extending therethrough, a hook extends from each clipping part to engage with the locking part.

6. The mounting apparatus of claim 5, wherein the hook is coplanar with the corresponding clipping part.

7. The mounting apparatus of claim 5, wherein an operation tab extends from the horizontal part of each clipping portion, for convenient manipulation of the clipping portion to deform the clipping portion, resulting in the clipping part engaging with or disengaging from the corresponding locking part.

8. A latching member for fixing an expansion card to a connector, the latching member comprising:

a top wall; and two sidewalls extending down from opposite sides of the top wall, configured for sandwiching the expansion card therebetween, wherein a slot is defined in each sidewall to form two elastic parts at opposite sides of the slot, a clipping portion is formed on a bottom end of each elastic part, configured to engage with the connector;

wherein the top wall comprises an elastic tab slantingly extending between the sidewalls from the bottom of the top wall, configured for elastically resisting against the top of the expansion card; the top wall and the sidewalls are formed by thin metal material or thin plastic material;

wherein the elastic parts of each sidewall are capable of being deformed toward each other, the clipping portions extend from the bottom ends of the elastic parts, respectively;

each clipping portion comprises a horizontal part perpendicularly extending outward from the bottom end of a corresponding elastic part, and a clipping part perpendicularly extending down from a distal end of the horizontal part opposite to the elastic part.

9. The latching member of claim 8, wherein a hook extends from the clipping part and is coplanar with the corresponding clipping part.

10. The latching member of claim 8, wherein an operation tab extends from the horizontal part of each clipping portion, for convenient manipulation of the clipping portion to deform the clipping portion.

\* \* \* \* \*